United States Patent [19]

Cistulli

[11] Patent Number: 5,196,788
[45] Date of Patent: Mar. 23, 1993

[54] SELF-CONTAINED FUNCTIONAL TEST APPARATUS FOR MODULAR CIRCUIT CARDS

[75] Inventor: Steven E. Cistulli, Bristol, R.I.

[73] Assignee: The United States of America as represented by the Secretary of the Navy, Washington, D.C.

[21] Appl. No.: 725,141

[22] Filed: Jul. 3, 1991

[51] Int. Cl.⁵ .............................................. G01R 31/28
[52] U.S. Cl. .................................. 324/158 R; 371/25.1
[58] Field of Search .............. 324/158 R, 73.1, 158 T; 371/25.1, 15.1, 22.1

[56] References Cited

U.S. PATENT DOCUMENTS

| | | | |
|---|---|---|---|
| 3,302,109 | 1/1967 | Jones | 324/158 R |
| 3,633,100 | 1/1972 | Heilweil et al. | 324/73.1 |
| 3,657,527 | 4/1972 | Kassabgi et al. | 371/25.1 |
| 4,637,020 | 1/1987 | Schinabeck | 371/25.1 |
| 4,771,428 | 9/1988 | Acuff et al. | 371/25.1 |

Primary Examiner—Ernest F. Karlsen
Attorney, Agent, or Firm—Michael J. McGowan; Prithvi C. Lall; Michael F. Oglo

[57] ABSTRACT

A self-contained test apparatus is provided for performing functional tests on any one of a plurality of varied function, modular circuit cards. The apparatus includes a power source and a series of switches electrically connecting the power source to the inputs of a modular circuit card under test. Each of the switches is manually set to a predetermined position based upon the function of the modular circuit card. One of either a TTL logical high or low is applied to each of the inputs. The test apparatus includes means for simulating the normal operational load characteristics of the modular circuit card in order to effectively test the card's function. Means are further provided for comparing a TTL logic response generated at each of the outputs with an expected response. The comparison is indicative of a pass-/fail condition at each output whereby the functional test is passed only if all outputs achieve a pass condition.

16 Claims, 2 Drawing Sheets

SELF-CONTAINED FUNCTIONAL TEST APPARATUS FOR MODULAR CIRCUIT CARDS

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1) Field of the Invention

The present invention relates generally to functional testing of circuit cards and more particularly to a self-contained functional test apparatus capable of performing functional tests on any one of a plurality of varied function, modular, digital logic circuit cards, including circuit cards employing transistor-transistor-logic (TTL) components.

(2) Description of the Prior Art

For years, testing of electrical systems has been required to provide indications of failed wiring and/or circuits. Prior art testing methods and apparatus range from time consuming manual operations to expensive and complex automatic testing devices that perform detailed testing. Accordingly, it is desirable to design testing devices that reduce the amount of manual operations while simultaneously minimizing the amount of detailed testing in order to minimize the cost and complexity of the device.

One such device is disclosed by Cheek et al in U.S. Pat. No. 3,728,616 issued Apr. 17, 1973. Cheek et al disclose a continuity testing apparatus that checks for wiring errors in connections between a plurality of pairs of terminals. The device uses a plurality of pairs of matched resistors whose relative values form a predetermined ratio. In addition, each pair of matched resistors have values that differ from the values of every other pair of resistors by some predetermined percentage. A known voltage is applied to each pair of resistors to produce a predetermined voltage drop across a selected one of each pair of resistors. If the actual voltage drop across the selected resistor differs from the predetermined voltage drop, a defective condition is indicated. Devices built according to the teachings of Cheek et al will only indicate breaks in wiring continuity by testing each and every wire connection. However, in many instances, it is more important to test a system functionally.

One such prior art functional tester is disclosed by Means in U.S. Pat. No. 4,251,765 issued Feb. 17, 1981. In particular, Means discloses a portable electrical system tester that may be connected to the "Caution" control system display panel of a military C-5A aircraft in order to detect failures in the display panel. However, the device is limited to the aforementioned specific use and is not readily adapted to any other use without a complete redesign.

Many of today's processing systems use a large number of specific function, modular circuit cards. The advantages achieved by using modular circuit cards in system processing design are numerous and generally well known in the art. For example, use of modular circuit cards allows particular processing functions to be assigned to a particular circuit card. Furthermore, since the costs associated with circuit cards and components has been greatly reduced over the years, it is now more cost effective to replace a failed circuit card than it is to troubleshoot the individual components thereon. Accordingly, it is becoming increasingly more important in these systems to develop testing equipment that can quickly provide an indication of a failed circuit card at the functional level.

Nowhere is this need more acute than in the military where the number of varied function modular circuit cards, (called Standard Electronic Modules (SEM)) used in any given system can easily be 25 or more. For example, the Navy's SEM's used in torpedo systems are tested manually during the system's development stages. When these systems are placed "in service", testing of SEM's has heretofore often been done on complex automatic test equipment. However, the time critical nature of many of these military systems makes it imperative that the operator of the system be able to quickly detect functional level failures of any one of the varied function circuit cards. Furthermore, the use of transistor-transistor-logic (TTL) on these circuit cards requires that the system operator be able to juggle power supplies to apply the correct TTL logical high or low to multiple pins on the circuit cards in order to detect a failed circuit card. As noted above, this type of testing is slow, inaccurate and prone to operator error which often leads to operator induced failure. Furthermore, in many applications, including the aforementioned torpedo systems, power required for troubleshooting a SEM card presents problems of safety to the technician.

SUMMARY OF THE INVENTION

Accordingly, it is an object of the present invention to provide a functional test apparatus that is adaptable for use with a plurality of varied function, modular digital logic circuit cards.

It is a further object of the present invention to provide a modular digital logic circuit card functional test apparatus that is self-contained and portable thereby providing bench-top test capability wherever needed.

Still another object of the present invention is to provide a modular digital logic circuit card functional test apparatus that simply and quickly determines functional level failures.

Yet another object of the present invention is to provide a modular digital logic circuit card functional test apparatus that requires minimal training in order to operate.

Another object of the present invention is to provide a modular digital logic circuit card functional test apparatus that is capable of applying numerous TTL logical high and low inputs required for a proper functional test.

Other objects and advantages of the present invention will become more obvious hereinafter in the specification and drawings.

In accordance with the present invention, a self-contained test apparatus capable of performing functional tests on any one of a plurality of varied function, modular circuit cards employing digital logic is provided. The cards share a common characteristic in that each has a series of first predetermined number of input terminals and a series of second predetermined number of output terminals. A series, equal in number to the first predetermined number, of single pole double throw switches are provided to electrically connect a regulated power source to the series of input terminals of the modular circuit card being tested. Each of the switches connected to a corresponding one of the series of input terminals has a predetermined position based upon the function of the modular circuit card being tested such that one of either a digital logic high or low is applied to each of the input terminals. First means are coupled to each output terminal of the series for simulating in-situ load characteristics of the modular circuit card being tested. In this way, a series, equal in number to the second predetermined number, of digital logic responses are generated at the corresponding output terminals. A series, equal in number to the second predetermined number, of second means are connected to the series of output terminals of the modular circuit card being tested. Each of the series of second means compares each generated digital logic response with the response expected at the same output terminal to generate a comparative result indicative of a pass/fail condition at each output terminal. The functional test is passed only if all outputs achieve a pass condition.

BRIEF DESCRIPTION OF THE DRAWING(s)

Figure 1:
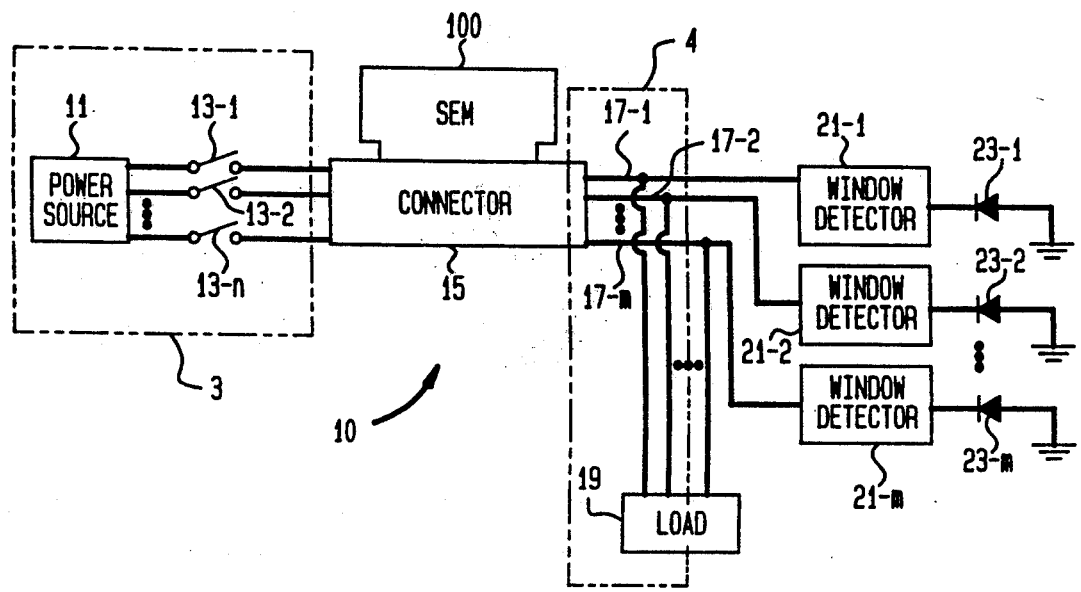
FIG. 1 is a block diagram of the modular circuit card tester according to the present invention.
Figure 4:
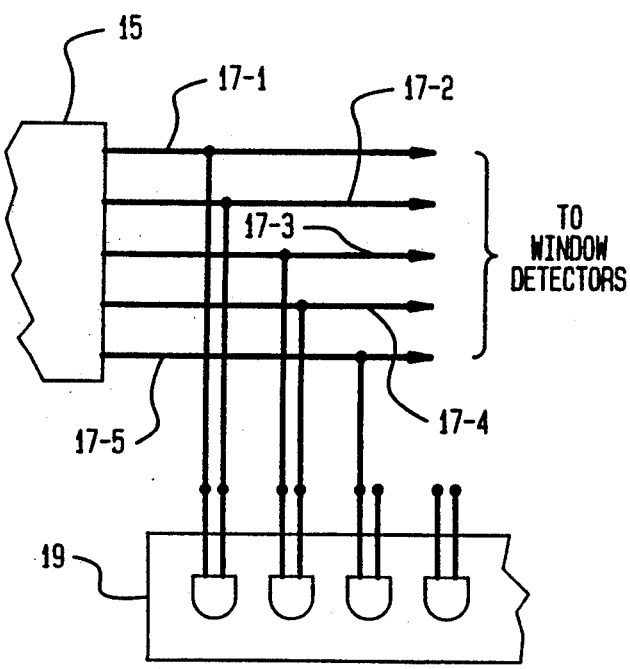

FIG. 4 a detail of another portion of FIG. 1 delineated by dashed line 4.

DESCRIPTION OF THE PREFERRED EMBODIMENT(s)

As will be readily apparent from the description to follow, the utility of the functional test apparatus of the present invention extends to any size modular circuit card design using digital logic. However, for purposes of description only, the preferred embodiment will be described relative to the Standard Electronic Module (SEM) used extensively by the military. The specifications for the SEM are explained in detail in the Military Standard MIL-STD-1389D, incorporated herein by reference.

Figure 2:
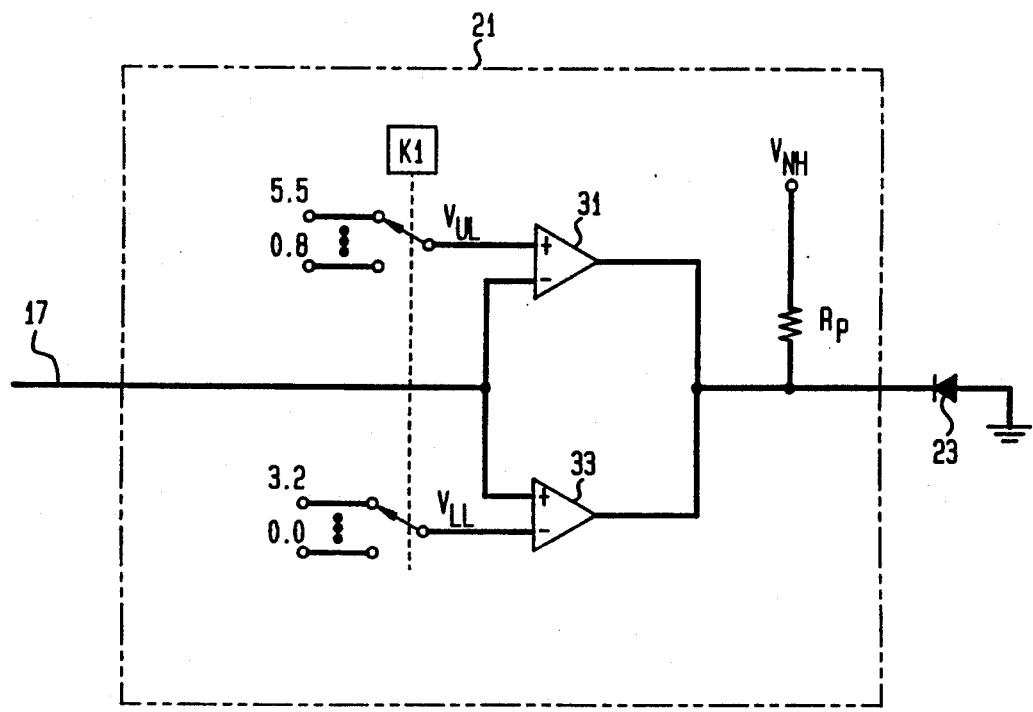
FIG. 2 is a window detector circuit diagram used in the tester of the present invention.
Figure 3:
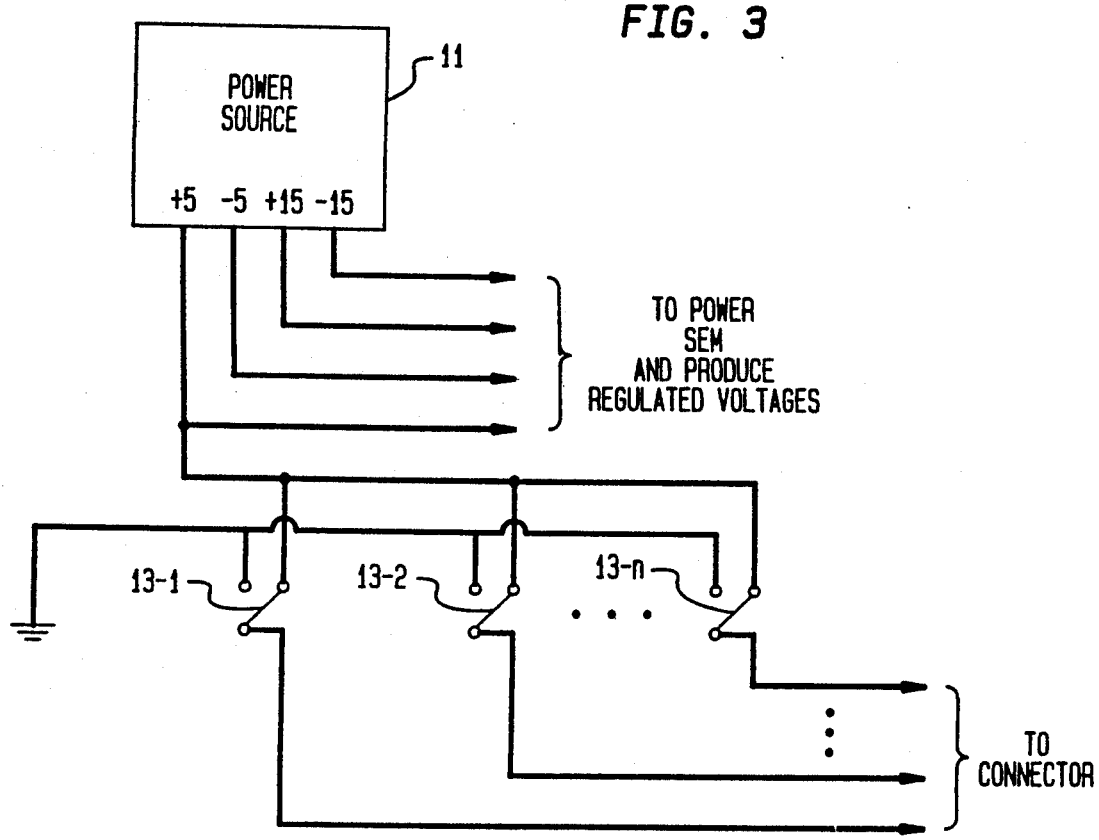
FIG. 3 is a detail of the portion of FIG. 1 delineated by dashed line 3.

Referring now to the drawings, and in particular to FIGS. 1 and 3, a block diagram is shown of the modular digital logic circuit card tester according to the present invention and is indicated generally by reference numeral 10. FIG. 2 is provided to provide greater detail with respect to the window detector circuits of FIG. 1. Finally, FIGS. 3 and 4 are provided to show greater detail for the portions of FIG. 1 delineated by dashed lines 3 and 4, respectively.

Tester 10 includes a regulated power source 11 connected to a predetermined series of manually set single pole, double throw (SPDT) switches 13-1, 13-2,..., 13-n where n is the number of inputs on a specific function modular circuit card such as SEM card 100 that employs digital logic. In the disclosed illustrative embodiment, the function of SEM card 100 will be based on employment of transistor-transistor-logic (TTL) components. Accordingly, power source 11 is typically a regulated DC power source capable of providing conditioned TTL logical high and TTL logical low voltage values. The actual values of these TTL logical highs and lows are a design consideration based on the function of a particular SEM card 100 under test. In addition, power source 11 typically will provide the power-up requirements for SEM card 100 as well as the voltage limits ($V_{UL}$ and $V_{LL}$) used by window detector circuits 21-1, 21-2,..., 21-m, as described in greater detail hereinafter. Accordingly, a typical power source 11 would be capable of providing ±15 and ±5 volts as shown in FIG. 3.

A standard plug-in connector 15 may be used to connect to switches 13-1, 13-2,..., 13-n to the SEM card 100 to be tested. Connector 15 may also be used to carry the outputs 17-1, 17-2,..., 17-m of SEM card 100 where m is the number of outputs required to adequately test the function of the SEM card 100. Note that there may or may not be a one-to-one correspondence between the number of inputs n and the number of outputs m.

Referring now to FIGS. 1 and 4, outputs 17-1, 17-2,..., 17-m are loaded to simulate normal operational load characteristics experienced by the particular function of SEM card 100 in order to properly perform a functional test of the SEM card 100. Accordingly, a load 19 is connected across each output 17-1, 17-2,..., 17-m. Each of the outputs 17-1, 17-2,..., 17-m must be loaded with a corresponding input supplied load 19. This is illustrated in FIG. 4 which represents the test of SEM card 100 (shown in FIG. 1) having a predetermined set of five output terminals. Load 19 may be implemented by any suitable off-the-shelf (OTS) integrated circuit (IC) device which provides a plurality of loads whose characteristics are commensurate to the "fan out" driven by the output. For example, the well known, multiple sourced LS 7407 multiple "AND" gate IC device is an appropriate load for many circuit cards whose functions are implemented by TTL. Experience indicates that a selected OTS IC device can serve as the load for all the cards of a functionally related set of SEM cards implemented by TTL circuitry. However, if a set of functionally related SEM cards (predominantly implemented by TTL circuitry) contain some cards that use RS 422 industry standard output drivers, certain output terminals from the series 17-1, 17-2,..., 17-m may be allocated exclusively for these RS 422 outputs. In such a case, another load (not shown) chosen to be appropriate for an RS-422 output is coupled to these certain terminals.

Each loaded output is then fed to a respective window detector circuit 21-1, 21-2,..., 21-m. As will be explained in greater detail hereinbelow, each window detector circuit 21-1, 21-2,..., 21-m is configured to expect a response that is one of either a TTL high or low based on the SEM card function. A window detector circuit is used since an acceptable TTL response may occur over a range of voltage values. If each loaded output matches (i.e., falls within the acceptable range of voltage values of) its corresponding expected response, the SEM card 100 is considered to have passed the functional test. If, however, any one of the window detector circuits 21-1, 21-2,..., 21-m, senses a "no match" condition, the SEM card is considered to have failed the functional test and, therefore, must be replaced. To assure that the functional tester 10 provides an active indication of the pass/fail condition, each window detector circuit 21-1, 21-2,..., 21-m, is connected to a corresponding bi-color color LED 23-1, 23-2,..., 23-m that glows, for example, green for the pass condition and red for the fail condition.

In order to provide a functional tester 10 that is adaptable to a plurality of varied function, SEM circuit cards, tester 10 allows for the manual setting of input switches 13-1, 13-2,..., 13-n as mentioned above. In addition, each window detector circuit 21-1, 21-2,..., 21-m must be provided with the ability to adapt itself to an expected TTL high or low response based on the particular SEM card being tested. It must also be appreciated that the window detector circuit may need to adjust its range of acceptable voltage values for the expected responses since the pass criteria varies for different functional SEM cards. For example, the pass criteria used for a SEM card employing a conventionally designed receiver-driver in conformity with the RS 422 industry standard is different than a SEM card which exclusively employs TTL components. With these capabilities in mind, the preferred embodiment uses a window detector circuit shown in detail in FIG. 2.

In FIG. 2, each window detector circuit 21 includes two operational amplifiers 31 and 33. Typically, operational amplifiers 31 and 33 are conventional LM 741 op amps. The loaded output 17 from the SEM card serves as the input to the inverting input of op amp 31 and the non-inverting input of op amp 33. The non-inverting input of op amp 31 is supplied with an upper range limit voltage value $V_{UL}$ while the inverting input of op amp 33 is supplied with a lower range limit voltage value $V_{LL}$.

In order to configure window detector circuit 21 to expect a TTL high or low response, regulated reference voltages are selected by the position of a relay K1. Relay K1 is typically a double pole, double throw relay. The position of relay K1 is predetermined and set by the test operator. The connection of $V_{UL}$ and $V_{LL}$ to the reference voltage sets the upper and lower limits, respectively, for a TTL high or low. For example, if $V_{UL}$ is connected to the 5.5 volt reference voltage and $V_{LL}$ is connected to the 3.2 volt reference voltage as shown (i.e., a 3.2 V–5.5 V TLL high), window detector circuit 21 will accept any voltage between $V_{LL}$ and $V_{UL}$ as a TTL high such that the corresponding bi-color LED 23 glows green. Conversely, relay K1 could connect $V_{UL}$ to 0.8 volts and $V_{LL}$ to 0.0 volts (i.e., a 0.0 V–0.8 V TTL low). Should the loaded output 17 from the SEM card fall outside the expected range in either of these TTL high or low situations, LED 23 would be biased to glow red. Furthermore, note that a plurality of reference voltages may be supplied depending on the tolerances desired for the acceptable range. Finally, a pull-up resistor $R_P$ is connected at the output of op amps 31 and 33 in order to guarantee a TTL high or low output. Accordingly, $R_P$ is supplied with $V_{NH}$ (typically +5.0 volts) or the nominal voltage indicative of a TTL high for the SEM card being tested.

Note that the values for a TTL high or low are merely design considerations that in no way limit the present invention. The number of input switches used and outputs to be checked are likewise design parameters based on the particular modular digital logic circuit card being tested.

The advantages of the present invention are numerous. The disclosed digital logic functional test apparatus is a self-contained, "bench-top" tester that is adaptable to a plurality of varied function, modular circuit cards such as the SEM circuit card design. A functional test that simulates operational load characteristics for a particular circuit card can be quickly performed by 1) plugging the circuit card to be tested into the tester, 2) manually setting input switches and output relays whose positions have been predetermined based on the particular circuit card, and 3) simply assuring that all bi-color LED's glow green to indicate a pass condition. The need to manually connect reference voltages to particular pins is eliminated. At the same time, the tester of the present invention uses inexpensive, off-the-shelf components to perform quick and simple functional tests. Such quick testing will be of great value to a systems operator faced with the task of troubleshooting a plurality of varied function, modular TTL circuit cards in a time critical environment.

While the present invention has been described relative to specific embodiments, it is not so limited. For instance, a pulse generator could be included in the tester if the circuit card being tested required a clock pulse. In addition, other window detector circuits may be used to carry out the same function as described above. For example, operational amplifiers 31 and 33 may be replaced with a combination of conventional LM 301 (comparator) IC devices and conventional LM 747 operational amplifier IC devices connected to function as a window detector circuit. Thus, it will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A self-contained test apparatus capable of performing functional tests on any one of a plurality of varied function, modular circuit cards employing digital logic, comprising:

a regulated power source;
   a series of manually set single pole double throw switches electrically connecting said power source to a series of input terminals of the modular circuit card being tested, each of said switches being connected to a corresponding one of the series of input terminals and having a predetermined position based upon the function of the modular circuit card being tested, wherein one of either a digital logic high or low is applied as a functional input to each of the input terminals;
   first means, coupled to each output terminal of a series of output terminals of the modular circuit card being tested, for simulating in-situ load characteristics of the modular circuit card being tested, wherein a series of digital logic responses are generated at the corresponding output terminals of the series of output terminals; and
   a series of second means connected to the series of output terminals of the modular circuit card being tested, each second means of said series comparing each generated digital logic response with a response expected at the same output terminal to generate a comparative result indicative of a pass/fail condition at each output terminal, whereby the functional test is passed only if all outputs achieve a pass condition.

2. An apparatus according to claim 1 wherein said regulated power source is a DC power source.

3. An apparatus according to claim 1, wherein each expected response is indicative of an expected digital logic response having a predetermined range indicative of one of either a digital logic high or a digital logic low, and wherein each of said second means comprises a window detector circuit configured to generate the pass condition when the digital logic response generated at the output terminal to which said window detector circuit is connected is within the predetermined range of the digital logic response expected at that output terminal.

4. An apparatus according to claim 3 wherein each of said window detector circuits is provided with a plurality of reference voltages for use in setting upper and lower limits corresponding to the predetermined range of the digital logic response expected at the output terminal to which said window detector circuit is connected.

5. An apparatus according to claim 4 wherein each of said window detector circuits includes a double pole double throw relay to select two of the reference voltages as the upper and lower limits, respectively.

6. An apparatus according to claim 5 wherein the each of said window detector circuit in each second means further includes:
   a first operational amplifier for receiving the selected upper limit reference voltage at its non-inverting input; and
   a second operational amplifier for receiving the selected lower limit reference voltage at its inverting input, wherein the inverting input of said first operational amplifier and the non-inverting input of said second operational amplifier receive the digital logic response generated at the corresponding output terminal.

7. An apparatus according to claim 1 further comprising a third means for actively indicating each comparative result.

8. An apparatus according to claim 6 wherein the window detector circuit in each second means is connected to a bi-directional LED biased to visually display one of either the corresponding pass or fail condition on the basis of which of these conditions is indicated at the corresponding output terminal.

9. An apparatus according to claim 1 wherein the digital logic employed by the modular circuit card is transistor-transistor-logic (TTL), wherein the expected responses at the series of output terminals of the modular circuit card being tested are based on the circuit card's function and voltage signal tolerances specified for normal operation of TTL digital circuitry.

10. A self-contained test system capable of performing functional tests comprising:
    a regulated power source;
    a modular circuit card employing digital logic having a series of first predetermined number of input terminals and a series of second predetermined number of output terminals;
    a series, equal in number to said first predetermined number, of manually set single pole double throw switches electrically connecting said power source to the series of input terminals of said modular circuit card, each of said switches being connected to a corresponding one of the series of input terminals and having a predetermined position designed to cause expected digital response at each of the output terminals based upon the function of said modular circuit card, wherein one of either a digital logic high or low is applied to each of the input terminals;
    first means coupled to each output terminal of the series of output terminals of said modular circuit card for simulating in-situ load characteristics of said modular circuit card, wherein a series, equal in number to said second predetermined number, of digital logic responses are generated at the corresponding output terminals of the series of output terminals; and
    second means, connected to each of the output terminals, for sensing each corresponding digital logic response caused to appear thereat, and for actively indicating: 1) a presence of a functional error in said modular circuit card if the digital logic response caused to appear at an output terminal does not match the digital response expected at the same output terminal or 2) an absence of a functional error in said modular circuit card if the digital logic response caused to appear at an output terminal does not match the digital response expected at the same output terminal, wherein each expected digital response encompasses a range of acceptable voltage signal values.

11. A system according to claim 10 wherein said second means comprises:
    a series, equal in number to said second predetermined number, of window detector circuits, each one of said series of window detector circuits being connected to a corresponding one of the output terminals of the series of output terminals for receiving each digital logic response caused to appear at an output terminal and for comparing such response with the expected digital response for the same output terminal; and
    a series of said second predetermined number of bi-directional LEDs, each of said LEDs being connected to a corresponding one of the window detector circuits and biased to visually indicate the presence or absence of a functional error with respect to the output terminal which the corresponding window detector is connected.

12. A system according to claim 11 wherein each expected response is indicative of an expected digital response having a predetermined range indicative of either a digital logic high or digital logic low, and wherein each one of said series of window detector circuits is provided with a plurality of reference voltages for use in setting upper and lower limits corresponding to the range of acceptable voltage signal values of the digital logic response expected at the output terminal to which the window detector circuit is connected.

13. A system according to claim 12 wherein each one of said series of window detector circuits includes a double pole double throw relay to select two of the reference voltages as the corresponding upper and lower limits, respectively.

14. A system according to claim 13 wherein each one of said series of window detector circuits further includes:
    a first operational amplifier for receiving the selected upper limit reference voltage at its non-inverting input; and
    a second operational amplifier for receiving the selected lower limit reference voltage at its inverting input wherein the inverting input of said first operational amplifier and the non-inverting input of said second operational amplifier receive the digital logic response caused to appear at the output terminal to which the window detector circuit is connected.

15. A system according to claim 10 wherein the digital logic employed by said modular circuit card is transistor-transistor-logic (TTL), wherein the expected responses at the series of output terminals of said modular circuit card are based on said modular circuit card's function and voltage signal tolerance specified for normal operation of TTL digital circuitry.

16. A self-contained test system capable of performing functional tests comprising:
   a regulated power source;
   a modular circuit card employing digital logic having a series of first predetermined number of input terminals and a series of second predetermined number of output terminals;
   a series, equal in number to said first predetermined number, of manually set single pole double throw switches electrically connecting said power source to the series of input terminals of said modular circuit card, each of said switches being connected to a corresponding one of the series of input terminals and having a predetermined position designed to cause an expected digital response at each of the output terminals based upon the function of said modular circuit card, wherein one of either a digital logic high or low is applied to each of the input terminals;
   means, coupled to each output terminal of the series of output terminals of said modular circuit card, for simulating in-situ load characteristics of said modular circuit card, wherein a series, equal in number to said second predetermined number, of digital logic responses are a generated at the corresponding output terminals of the series of output terminals;
   a series, equal in number to said second predetermined number, of window detector circuits, each one of said series of window detector circuits being connected to a corresponding one of the output terminals of the series of output terminals for receiving each digital logic response caused to appear at an output terminal and for comparing such response with the expected digital response for the same output terminal, each of said series of window detector circuits including a first operational amplifier receiving an upper limit reference voltage at its non-inverting input indicative of an acceptable upper limit for the expected digital response, and a second operational amplifier receiving a lower limit reference voltage at its inverting input indicative of an acceptable lower limit for the expected digital response, wherein the inverting input of said first operational amplifier and the non-inverting input of said second operational amplifier receive the digital logic response caused to appear at the output terminal to which the window detector circuit is connected whereby, for each of said window circuits, a pass condition signal is output if and only if the digital logic response is between the upper and lower limit reference voltages; and
   a series of said second predetermined number of bi-directional LEDs, each of said LEDs being connected to a corresponding one of the window detector circuits and biased to visually indicate the presence or absence of the pass condition signal with respect to the output terminal which the corresponding window detector is connected.

* * * * *